(12) United States Patent
Harbord et al.

(10) Patent No.: US 6,944,569 B2
(45) Date of Patent: Sep. 13, 2005

(54) METHOD AND APPARATUS FOR GENERATING AN ELECTRONIC TEST SIGNAL

(75) Inventors: Philip James Harbord, Norwich (GB); Alastair Fields, Norwich (GB)

(73) Assignee: Fluke Precision Measurement Ltd., Norwich (GB)

( * ) Notice: Subject to any disclaimer, the term of this patent is extended or adjusted under 35 U.S.C. 154(b) by 237 days.

(21) Appl. No.: 10/405,050

(22) Filed: Apr. 1, 2003

(65) Prior Publication Data

US 2004/0220766 A1 Nov. 4, 2004

(51) Int. Cl.⁷ ............................................. H04B 1/10
(52) U.S. Cl. ..................................... 702/124; 702/126
(58) Field of Search ............................. 702/124–126, 702/75–79, 189–191, 195; 327/39, 42, 44–46; 375/226

(56) References Cited

U.S. PATENT DOCUMENTS

| | | | | |
|---|---|---|---|---|
| 5,469,087 A | * | 11/1995 | Eatwell | 327/40 |
| 5,642,300 A | | 6/1997 | Gubisch et al. | 364/571.01 |
| 6,002,717 A | * | 12/1999 | Gaudet | 375/232 |

OTHER PUBLICATIONS

Coombes; Improving Accuracy of Power and Power Quality Measurements; United Kingdom, Date: unknown.

* cited by examiner

Primary Examiner—Marc S. Hoff
Assistant Examiner—Craig Steven Miller
(74) Attorney, Agent, or Firm—Bourque & Associates

(57) ABSTRACT

The present invention relates to a method and an apparatus for generating an electronic test signal, and particularly to the use of such a method and apparatus for calibrating meters used to measure electrical characteristics such as voltage, current, phase angle and power. A user may select via a user input control the frequency domain characteristics of a desired electronic test signal including a user-defined set of amplitudes and phases of a fundamental frequency and one or more harmonic frequencies. A processor generates from the user-defined set of amplitudes and phases a frequency domain output set of amplitudes and phases for the fundamental frequency and one or more harmonic frequencies, which is then converted into a first time domain set of amplitudes extending over at least one cycle of the fundamental frequency. The first time domain set of amplitudes is communicated to a digital-to-analog output stage which generates an electronic test signal corresponding to the time domain set of amplitudes. The test signal is fed back to an analog-to-digital feedback input stage which generates a feedback time domain set of amplitudes extending over at least one cycle of the fundamental frequency. The feedback time domain set of amplitudes is converted by the processor into a feedback frequency domain set of amplitudes and phases for the fundamental frequency and one or more harmonic frequencies. The processor then compares the feedback frequency domain set of amplitudes and phases with the user-defined set of amplitudes and phases, and when necessary modifies the output set of amplitudes and phases to reduce any differences between the feedback time domain set of amplitudes and phases and the user-defined set of amplitudes and phases.

21 Claims, 7 Drawing Sheets

METHOD AND APPARATUS FOR GENERATING AN ELECTRONIC TEST SIGNAL

FIELD OF THE INVENTION

The present invention relates to a method and an apparatus for generating an electronic test signal, and particularly to the use of such a method an apparatus for calibrating, verifying and evaluating meters used to measure the electrical characteristics such as voltage and current, phase angle, power and supply quality phenomena.

BACKGROUND OF THE INVENTION

There is always a demand for increased accuracy in the measurement of electrical parameters, such as voltage and current or phase and power. In order to ensure and maintain accuracy of such measurements, an electrical measuring device or unit under test (UUT), such a voltage meter, current meter, power meter, etc, will itself have to be calibrated with reference to a standard device whose calibration can be traced back to national standards.

An example of this is the need to measure electrical power in mains electricity generation and supply. In recent years, following deregulation of the electrical generation and distribution networks, there has been an increased demand for the accurate measurement and monitoring of electrical power, both on domestic and industrial scales of power consumption. There is also the increased need for increased accuracy of measurement in electricity traded between electricity generators. However, at the same time, main electrical power has become "dirtier", with increased high frequency noise and low frequency flicker, making measurement more difficult, particularly quantifying variability in the electrical supply and errors in the measurement of electrical power.

An electric power meter or revenue meter (kWh meter) may be calibrated in various ways. Two common ways of calibrating an electric power meter involve either placing the standard meter in a series and/or parallel connection with the UUT and then making simultaneous measurements, or making sequential measurements by switching or substitution of the standard meter and the UUT. The first is to substitute a more accurate voltage and/or current measuring device in place of the meter being calibrated. In order to calculate the power, it is also necessary to know or to measure the phase angle between the voltage and current being measured. Once the measurement has been performed this is then compared with the measurement provided by the meter. The meter is then adjusted to agree with the measurement made by the standard device. A problem with this method is that the electrical output of the source may change between measurements.

An alternative is therefore to use both the standard device and the meter at the same time to make the measurements. This, however, creates problems owing to the possible interaction between the standard device and meter.

There are a number of problems with this approach, particularly when the measurements are being performed on the mains power supply or the output of an electrical generator. Partly, this is because the calibration is done under the particular conditions prevailing at the time of the calibration. It may be desired to calibrate the meter under a wider range of conditions. For example, harmonic distortion in the mains power may vary depending on the time of day, and it may therefore be desirable to perform measurements under all possible conditions, including conditions in which various types of harmonic distortion are present.

Problems may also arise if the standard meter and the UUT do not present equivalent loads to the electrical source.

One technique used to measure low frequency flicker is to simulate this by switching a load to develop a potential difference across a reference impedance. Careful selection of the reference impedance and the switched impedances yield signals of sufficient accuracy to calibrate flicker meters. Such measurements can also be adversely affected if there is noise on the mains power, or if the source impedance is not zero, or if there is harmonic distortion of the mains supply.

There is a growing requirement to characterize and verify the performance of power measurement instruments in the presence of differing forms of distortion and anomalies. The standards IEC61000-4-30 (currently in draft form) and IEEE P1159.1 both require that power quality measurement instruments are calibrated in the presence of simultaneous, multiple forms of anomalous signal. For example, a flicker measurement is calibrated in the presence of controlled amounts of harmonic distortion. While the limitations in accuracy described above may be acceptable in some cases, none of the approaches outlined above is able to provide the facility for calibration when simultaneous degradations in the mains signal are present.

It has therefore been proposed to use a known source to calibrate an electrical measurement device. In the case of calibrating a power meter, it is therefore necessary to generate an electrical test signal having known electrical characteristics, which can be traced back to national standards. The accuracy of the calibration will therefore depend on the accuracy of the signal generation, and the usefulness of the source will depend on the ability to generate a wide range of signal characteristics within the required calibration accuracy. Prior art signal generation devices have not been sufficiently accurate and/or quick to use. Because of the difficulty generating suitable signals, standard signal sources have not been widely used in applications such as the measurement of mains power characteristics.

SUMMARY OF THE INVENTION

It is therefore an object of the current invention to provide a more convenient method and an apparatus for generating an electronic test signal, and particularly an electronic test signal that may be used to calibrate electrical power meters, revenue meters and mains disturbance meters.

Accordingly, the invention provides an apparatus for generating an electronic test signal, comprising a user input control, a processor, a digital-to-analog output stage, a test signal output, a feedback input, and an analog-to-digital feedback input stage, wherein:

a) the user input control is operable to allow a user to select the frequency domain characteristics of a desired electronic test signal including a user-defined set of amplitudes and phases of a fundamental frequency and one or more harmonic frequencies.

b) the processor is arranged to receive from the user input control said user-defined set of amplitudes and phases and to generate from the user-defined set of amplitudes and phases an output set of amplitudes and phases for the fundamental frequency and one or more harmonic frequencies;

c) the processor is arranged to convert the output set of amplitudes and phases into a first time domain set of amplitudes extending over at least one cycle of the fundamental frequency;

d) the digital-to-analog output stage is arranged to receive from the processor the first time domain set of amplitudes and to generate therefrom an electronic test signal corresponding to the time domain set of amplitudes and to present said electronic test signal to the test signal output;

e) the feedback signal input is operable to allow a user to feed back the electronic test signal into the analog-to-digital feedback input stage and to generate therefrom a feedback time domain set of amplitudes extending over at least one cycle of the fundamental frequency;

f) the processor is arranged to receive the feedback time domain set of amplitudes and to generate from the feedback time domain set of amplitudes, a feedback frequency domain set of amplitudes and phases for the fundamental frequency and one or more harmonic frequencies; and g) the processor is arranged to compare the feedback frequency domain set of amplitudes and phases with the user-defined set of amplitudes and phases, and when necessary to modify the output set of amplitudes and phases depending on said comparison in order to reduce any differences between the feedback frequency domain set of amplitudes and phases and the user-defined set of amplitudes and phases.

The invention also provides a method for generating an electronic test signal, using an apparatus comprising a user input control, a processor, a digital-to-analog output stage, a test signal output, a feedback input, and an analog-to-digital feedback input stage, wherein the method comprises the steps of:

i) selecting via the user input control the frequency domain characteristics of a desired electronic test signal including a user-defined set of amplitudes and phases of a fundamental frequency and one or more harmonic frequencies;

ii) communicating said user-defined set of amplitudes and phases to the processor and using the processor to generate from the user-defined set of amplitudes and phases an output set of amplitudes and phases for the fundamental frequency and one or more harmonic frequencies;

iii) using the processor to convert the output set of amplitudes and phases into a first time domain set of amplitudes extending over at least one cycle of the fundamental frequency;

iv) communicating the first time domain set of amplitudes to the digital-to-analog output stage and using the digital-to-analog output stage to generate an electronic test signal corresponding to the time domain set of amplitudes, and providing at the test signal output said electronic test signal;

v) providing feed back from the electronic test signal at the feedback signal input and communicating said feedback to the analog-to-digital feedback input stage and using the analog-to-digital feedback input stage to generate a feedback time domain set of amplitudes extending over at least one cycle of the fundamental frequency;

vi) communicating the feedback time domain set of amplitudes to the processor and using the processor to generate from the feedback time domain set of amplitudes a feedback frequency domain set of amplitudes and phases for the fundamental frequency and one or more harmonic frequencies; and vii) using the processor to compare the feedback frequency domain set of amplitudes and phases with the user-defined set of amplitudes and phases, and when necessary modifying the output set of amplitudes and phases depending on said comparison in order to reduce any differences between the feedback frequency domain set of amplitudes and phases and the user-defined set of amplitudes and phases.

The processor may, in step vi), average the frequency or time domain set of amplitudes prior to generating the feedback frequency domain set of amplitudes and phases.

BRIEF DESCRIPTION OF THE DRAWINGS

The invention will now be described by way of example, with reference to the accompanying drawings, in which.

DETAILED DESCRIPTION OF THE PREFERRED EMBODIMENT

Figure 1:
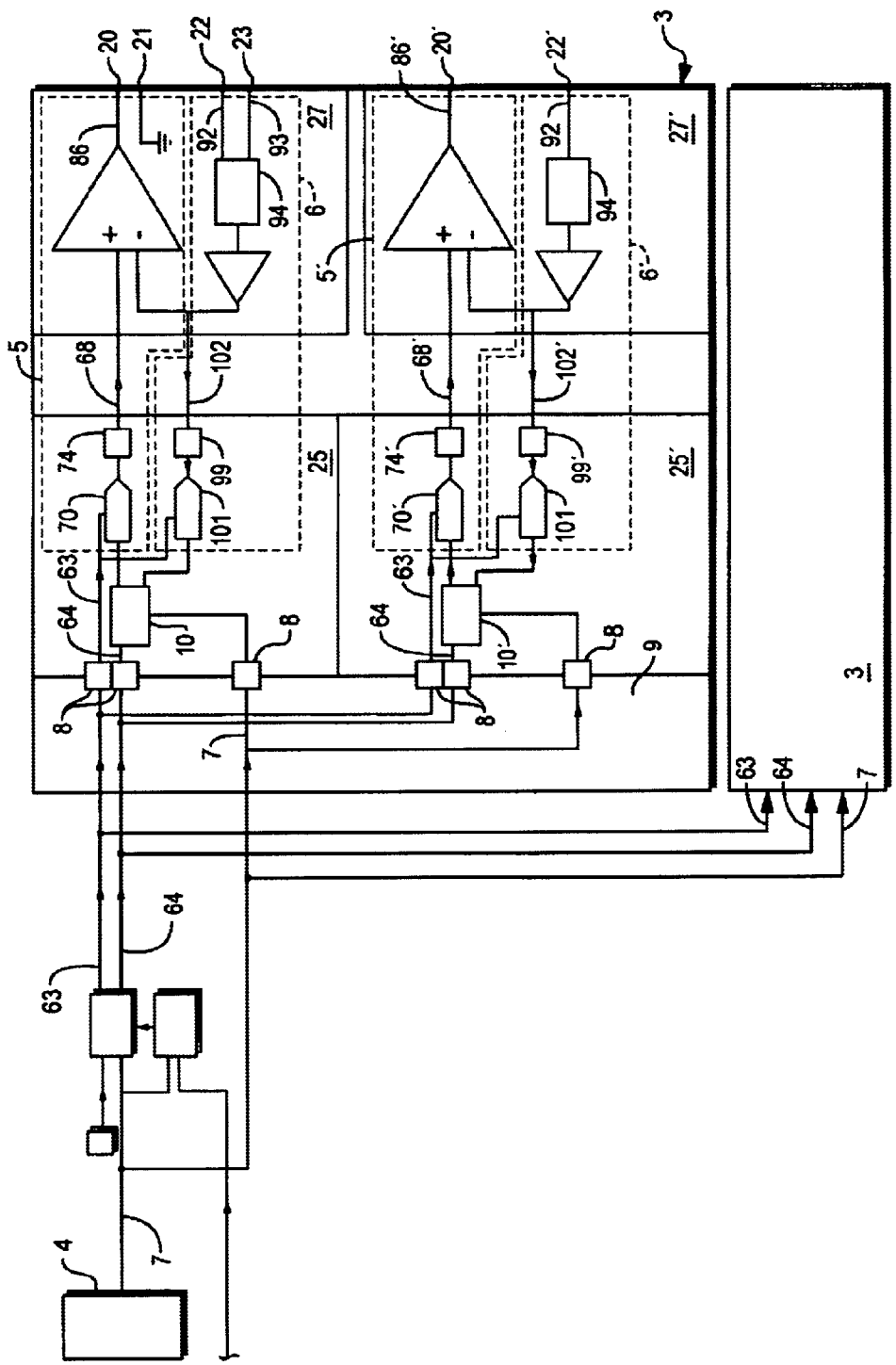
FIG. 1 is a block circuit diagram of an apparatus for generating separate voltage and current electronic test signals, according to a preferred embodiment of the invention, having an input stage by which a user may select the frequency domain characteristics of a desired electronic test signal and optionally also a desired modulation or distortion of the test signal, a digital signal processor (DSP) for processing the desired signal, and an analog output stage for generating the signal and receiving a feedback signal.

FIG. 1 shows a schematic block circuit diagram of an apparatus 1 having a plurality of signal generators 3 for generating electronic test signals. Each signal generator 3 is arranged to generate a voltage test signal 86 and a current test signal 86'. The voltage and current test signals 86,86' are independent from each other.

The apparatus 1 also comprises an embedded personal computer 4 having a keyboard, mouse, and a user display for displaying a user interface (not shown). The computer 4 is used as a user input control by which a user may control the operation of the signal generators 3.

The user may use the user input control 4 to define the characteristics of the signals 86,86' in the frequency (v) domain in terms of the amplitude and phase of a fundamental frequency, referred to in this description as the harmonic "1" and a plurality of harmonic frequencies which will usually be integer multiples of the fundamental frequency. In the present example, the definition may be for up to 99 harmonic frequencies, referred to in this description as harmonics "2" to "100". Optionally, the user input control may also permit the user to define a DC component in the output electronic test signal 20, referred to in this description as a "zeroth" harmonic, or harmonic "0".

A PC104 bus 7 from the PC 4 is connected to each signal generator 3 via optocouplers 8 in an earth isolation section 9. A line locking phase detector 19 uses a phase locked loop to lock a sample clock 63 and a cycle clock 64 to the incoming mains frequency by detecting the zero crossings of a heavily filtered mains waveform 24 (LINE_LOCK_REF).

The sample clock 63 determines the number of samples used in the generation of the output signals 86,86', and the cycle clock 64 gives one pulse per cycle of the generated fundamental frequency. The sample clock synchronizes the operation of a two similar DSPs 10,10' in signal generator 3, one of which 10 is in a floating voltage section 25 for generating the voltage test signal 86, and the other of which 10' is in a floating current section 25'. The voltage and current DSPs 10,10', and associated digital and analog electronics, provide and receive signals 68,102,68',102' from respectively a voltage output section 27 and a current output section 27'. Because of the similarities between the voltage sections 25,27 and the current sections 25',27' of the signal generator 83, the forgoing description will be restricted to that for the voltage test signal 86, although similar components in the current generation section are illustrated in FIG. 1 with the same reference numerals primed.

Figure 2:
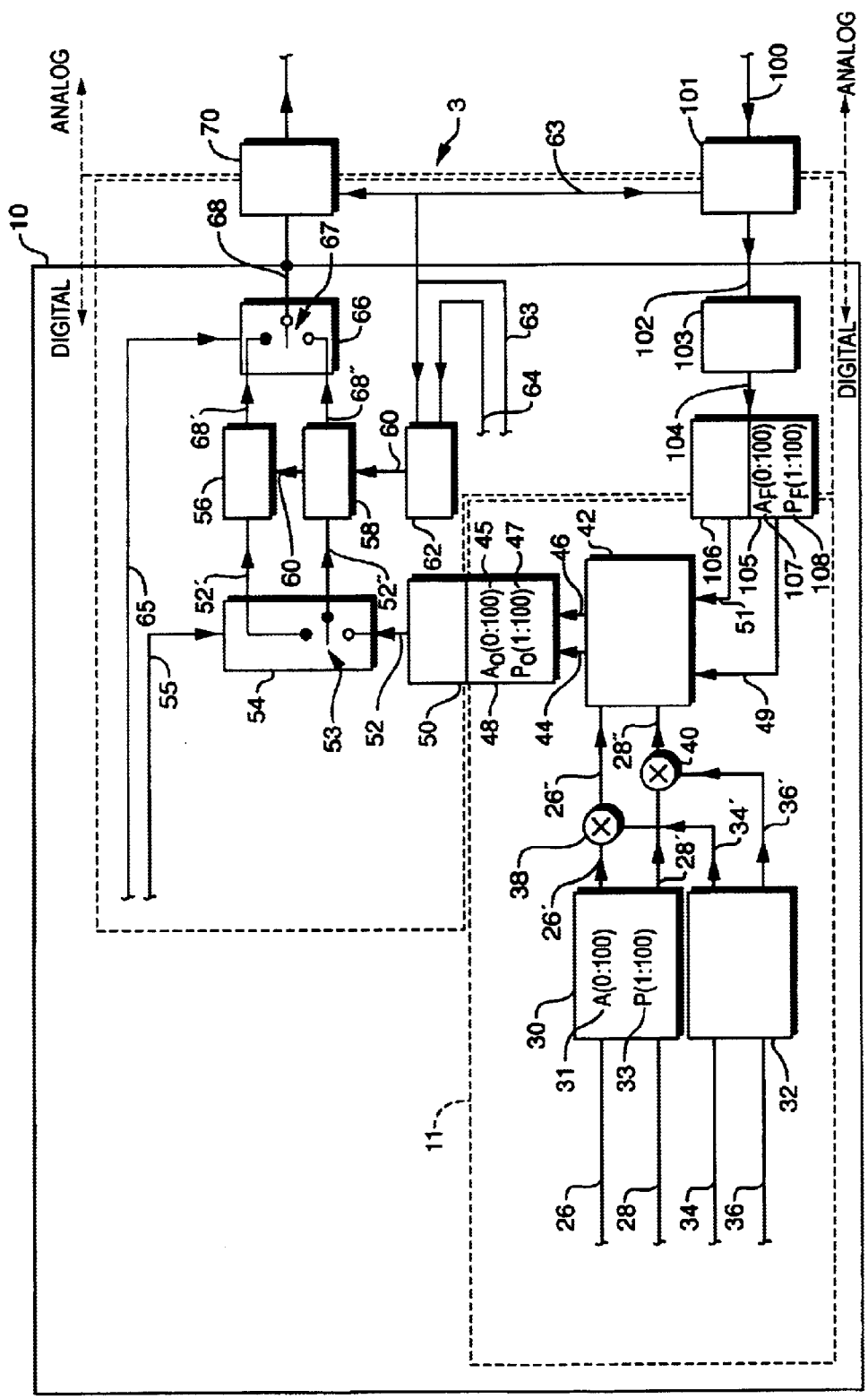
FIGS. 2 and 3 are block schematic diagrams, showing conceptually how the voltage generation section of the apparatus of FIG. 1 works in a first embodiment of the invention not having the capability to modulate the test signal.
Figure 3:
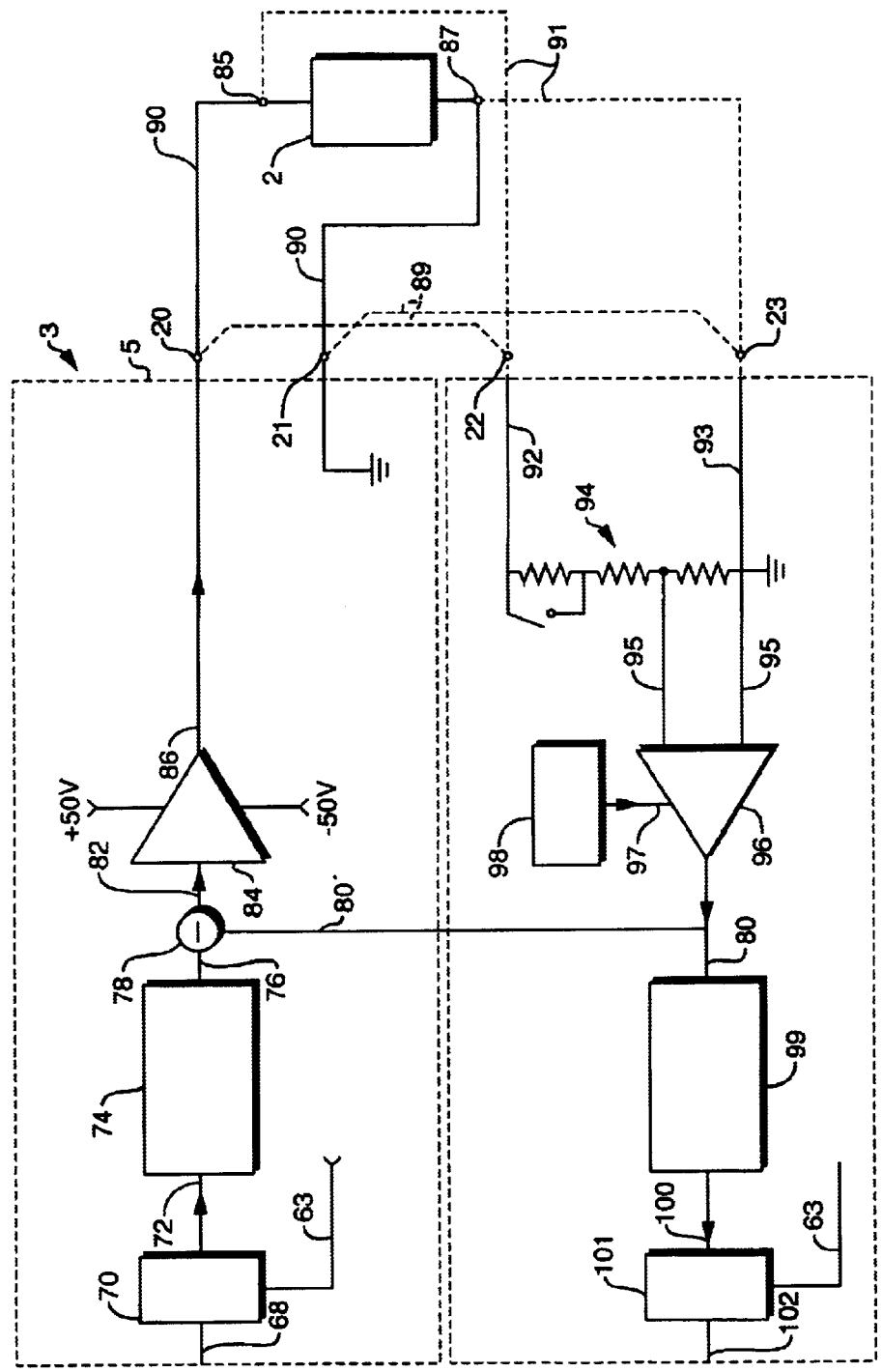

Reference is now made also to FIGS. 2 and 3, which together illustrate how the signal generator 3 of FIG. 1 is arranged to generate the cyclic electronic test signal 86 at a test signal output 20 suitable for calibrating a Unit Under Test (UUT) 2, which may be an electric power meter, revenue meter, or the like. The DSP 10 used in the signal generator 3 is manufactured by Analog Devices, Inc, under part number ADSP 21065L. The DSP 10 operates at a clock frequency of 60 MHz.

As will be explained in greater detail below, the DSP processes data that represents quantities in both the frequency (v) domain and the time (t) domain, shown respectively by the dashed outlines 11 and 12 in FIG. 2. Frequency (v) domain data is expressed in terms of amplitudes and phases for a plurality of frequencies including a fundamental frequency and a number of harmonic frequencies. Time (t) domain data is expressed in terms of a time sequence of amplitudes extending over at least one period of the fundamental frequency.

In the case of power measurement of mains electricity, the fundamental frequency will normally be either 50 Hz or 60 Hz.

The DSP 10 receives along the PC104 Bus 7 from the PC user input control 4 a set of user defined amplitudes 26 and a set of user define phases 28, one for each of the amplitude harmonics "0 to 100" and each of the phase harmonics "1 to 100", and stores these as sets A(0:100) 31 and P(1:100) 33 in a user input waveform table 30. The user input control 4 is therefore operable to allow a user to select the frequency (v) domain characteristics of a desired electronic test signal 86 in terms of user-defined sets 31,33 of amplitudes and phases of a fundamental frequency and one or more harmonic frequencies.

The DSP 10 also stores in a calibration correction waveform table 32 a plurality of range amplitude corrections 34 and a plurality of range phase corrections 36, corresponding to the 100 user defined amplitudes 26, and 99 user defined phases 28. These corrections 34,36 are necessary to correct for imperfections in the hardware. In practice, the range amplitude corrections 34,36 may be set at extended intervals, for example in a yearly factory servicing of the apparatus 1.

Each of the individual user defined amplitudes (A) 26' and phases (P) 28' is then multiplied 38,40 by the corresponding individual range amplitude correction (Ca) 34' and range phase correction (Cp) 36', to generate a series of corrected individual user defined amplitudes (Au) 26" and phases (Pu) 28", which are used in amplitude and phase closed loop control algorithms 42, described in more detail below. Any of the correction factors 34,36 may be unity or zero respectively if there is no need to change a particular user defined amplitude or phase, but in general will vary slightly above and below unity or zero, for example by ±1%.

When the signal generation apparatus 1 is initially turned on, there will be no available digital feedback signal 102. The corrected individual user defined amplitudes and phases 26",28" are then passed unmodified as individual output user defined amplitudes and phases 44,46 and stored in an output waveform table 48 as corresponding sets of output amplitudes and phases Ao(0:100) 45 and Po(1:100) 47, for the fundamental frequency and one or more harmonic frequencies.

An inverse Fast Fourier Transform (FFT) 50 is then performed on the output sets Ao(0:100) 45 and Po(1:100) 47 to create a digitized waveform (Wn) 52, which preferably consists of at least 1024 sequential amplitudes that extend over at least one period of the fundamental frequency of the user defined waveform 26",28". The DSP 10 is therefore arranged to convert the output sets of amplitudes Ao(0:100) 45 and phases Po(1:100) 47 into a first time domain set of amplitudes Wn 52.

The digitized waveform 52 is directed 53 by a select function 54 under the control of a wavetable load select signal (LS) 55, to one of a pair of wavetables 56,58. Initially, both wavetables 56,58 are empty, and the waveform 52 is directed 53 to one of the wavetables, for example, wavetable 56 marked "Wavetable 1" in FIG. 2. As will be explained in greater detail below, subsequent waveforms Wn are input alternately 52',52" between the pairs of wavetables 56,58, each time replacing and updating a previous wavetable stored in each wavetable 56,58. This process is shown in FIG. 2 by the indication Wn−2 ? Wn in one of the wavetables 56. In a subsequent cycle of waveform generation, the other wavetable 58 would be updated as Wn−1 ? Wn+1.

It should be noted that if there is not just one cycle of the fundamental frequency in the wavetables 56,58, the user input signals valves 26",28" may include non-integer multiple of the fundamental frequency.

After the digitized waveform 52 has been input 52',52" into one or the other of the wavetables 56,58, the digitized values of the waveforms stored in each of the wavetables 56,58 are sequentially output 68',68" from the wavetables 56,58 in synchrony with a phase address clock 60 received by each of the wavetables 56,58. The phase address clock 60 is generated by an address generator 62, which in turn is synchronised by the sample clock 63 and the cycle clock 64 generated with the DSP 10. The sample clock 62 gives one pulse per digitized value output from the wavetables 56,58, and the cycle clock 64 gives one pulse per cycle of the fundamental frequency, thereby synchronising the electronic test signal 86 generated by the apparatus 1 to a known period.

A second select function 66 receives a wavetable output select signal (OS) 65, and in response to this select signal directs 67 one of the wavetable outputs 68',68" as a selected digitized waveform 68 to be output from the DSP 10.

In this process, it should be noted that the wavetable output select signal 65 and the wavetable load select signal 55 are synchronized so that as a new waveform Wn 52 is being loaded 52' into one wavetable 56, the immediately previous waveform Wn−1 52" is selected 67 from the other wavetable 58 as the signal output from the DSP 10.

The waveform 68 output from the DSP 10 is received by a 16-bit digital-to-analog converter (DAC) 70, which is also synchronized to the waveform output 68 by the sample clock 63. The DAC 70 is a high stability, low temperature coefficient, high linearity part. As shown in FIG. 3, the DAC 70 generates an analog output (S) 72, which is passed to a low-pass reconstruction filter 74. The reconstruction filter is an 8-pole Butterworth filter. As will be explained in further detail below, an output (SL) 76 from the low pass reconstruction filter is summed 78 with negative feedback 80' from the analog-to-digital feedback input stage 6, derived from the from the feedback signal, to provide the input 82 for amplification by a high voltage power amplifier 84. The amplifier 84 then generates the electronic test signal (So) 86 and presents this at the electronic test signal output 20.

The analogue components from the DAC 70 to the signal output 20 form the digital-to-analog output stage 5.

The user can then connect live and ground terminals 85,87 on the unit under test (UUT) 2 to the signal output connection 20 and an output ground connection 21 of the apparatus 1, using suitable connection cables 90.

Two typical ways of providing a feedback connection to the apparatus 1 from the unit under test 2 are illustrated in FIG. 3, with short dashed lines 89 and intermittent dashed lines 91. In one way, direct connections 89 are made from the signal output 20 to the feedback input 22, and from the output ground connection 21 to the feedback ground connection 23. In the other, connections 91 are made from the corresponding live terminal 85 on the unit under test 2 to the feedback input 22, and the ground terminal 87 on the unit under test 2 to the feedback ground connection 23.

The apparatus therefore receives live and ground feedback inputs 92,93, which may be attenuated by means of a user-operable feedback attenuator 94.

The feedback attenuator supplies an attenuated feedback signal to an input 95 to a feedback amplifier 96. The feedback amplifier 96 receives a gain signal 97 from a feedback amplifier gain control 98. The feedback amplifier gain control 98 selects the gain from a pre-defined set of ranges that are user selectable.

The feedback amplifier generates a feedback signal (FG) 80, which is used for the negative feedback 80' to the high voltage power amplifier 84. The negative feedback 80' is used to achieve a reasonable level of performance and output stability prior to the digital feedback being applied.

The feedback signal passes through a low-pass anti-alias filter 99 which generates a low-pass feedback signal (F) 100. The anti-alias filter 99 is a 4-pole Butterworth filter with a linear phase response over the frequencies of interest so the phase errors introduced by the filter 99 can easily be corrected for.

The low-pass feedback signal is then received by a 16-bit analog-to-digital converter (ADC) 101, which generates a digitized output 102 in synchrony with the sample clock 63.

The analogue components from the feedback input 22 to the ADC 101 form the analog-to-digital output stage 6.

Reference is now made again to FIG. 2. The DSP 10 receives the digitized feedback 102 from the ADC 101, and stores this in a sample wavetable 103, in which signal averaging is performed on the digitized feedback 102.

The averaged feedback waveform (WF) 104 thus generated is then supplied to a feedback waveform table 105, and processed through a Fast Fourier Transform (FFT) 106 to generate a set of feedback amplitudes AF(0:100), 107 for DC, the fundamental frequency and 99 higher harmonics, and a set of feedback phases PF(1:100) 108 for the fundamental frequency and 99 higher harmonics. The elements in the sets of feedback amplitudes and phases 107,108 are then supplied to the amplitude and phase closed loop control algorithms 42 as individual feedback amplitudes 49 and individual feedback phases 51.

The algorithms 42 compare each element AF 49 and PF 51 of the feedback frequency domain set of amplitudes and phases AF(0:100) 107 and PF(1:100) 108 with each corresponding corrected element Au 26" and Pu 28" of the user-defined set of amplitudes and phases A(0:100) 31 and P(1:100) 33, and when necessary modifies the corresponding elements Ao 44 and Po 46 in the output set of amplitudes and phases Ao(0:100) 45 and Po(1:100) 47, depending on the results of the comparison in order to reduce any differences between the feedback frequency domain set of amplitudes and phases 107,108 and the user-defined set of amplitudes and phases 31,33.

Figure 5:
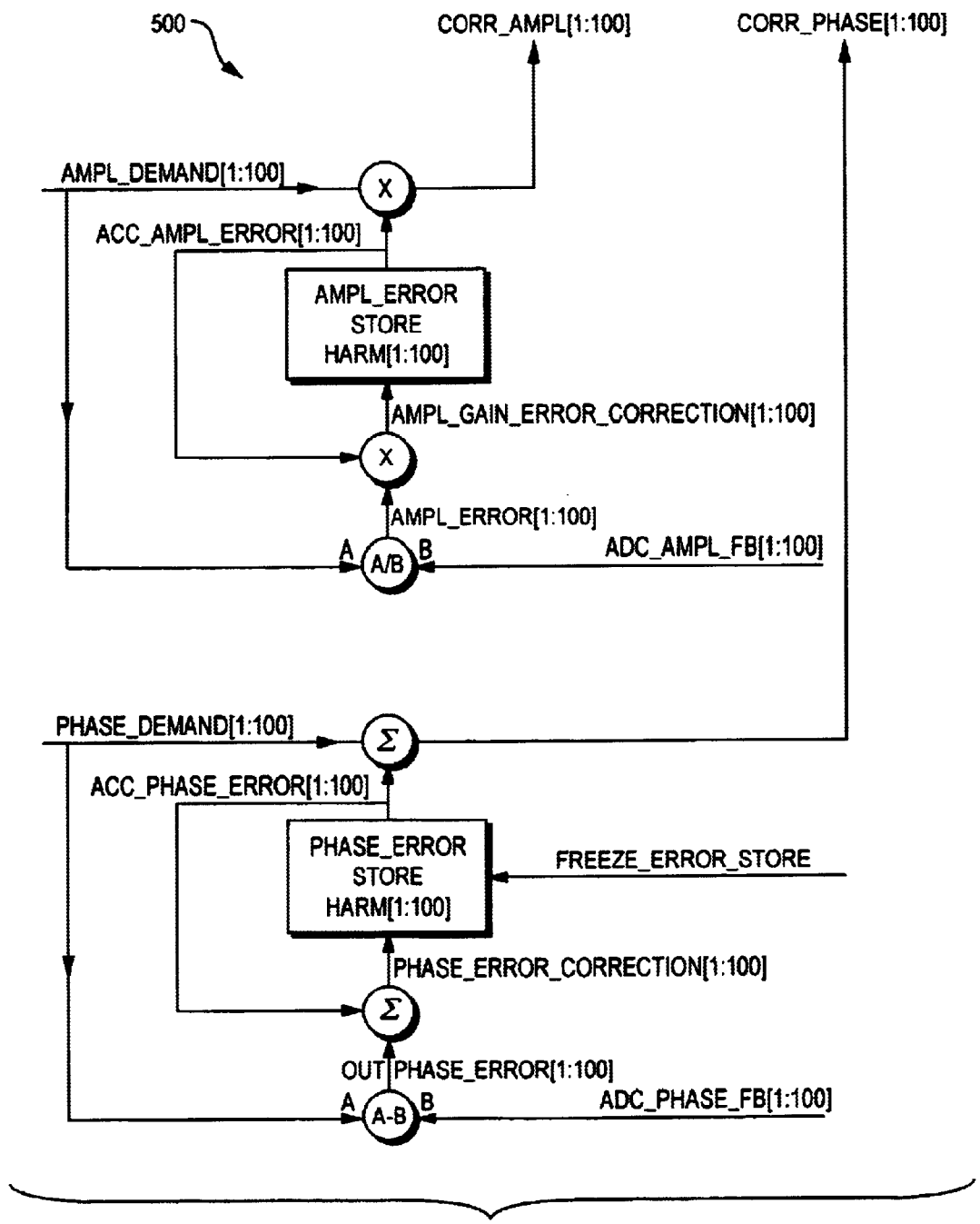
FIG. 5 is a block schematic diagram, showing conceptually how the DSP corrects feedback amplitude and phase in the frequency domain for signals having an amplitude above a predetermined threshold.
Figure 6:
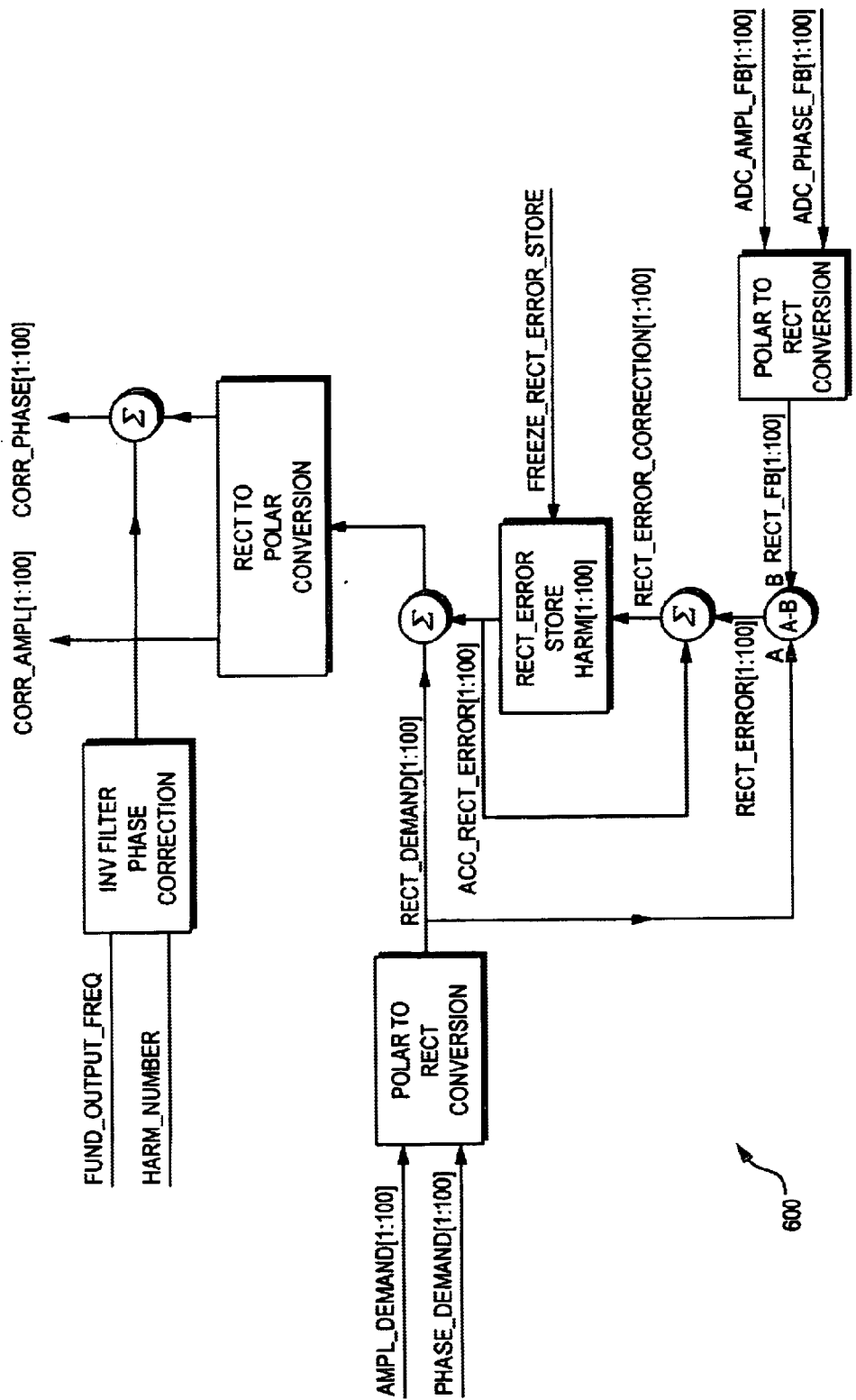
FIG. 6 is a block schematic diagram, showing conceptually how the DSP corrects feedback amplitude and phase in the frequency domain for signals having an amplitude below a predetermined threshold.
Figure 7:
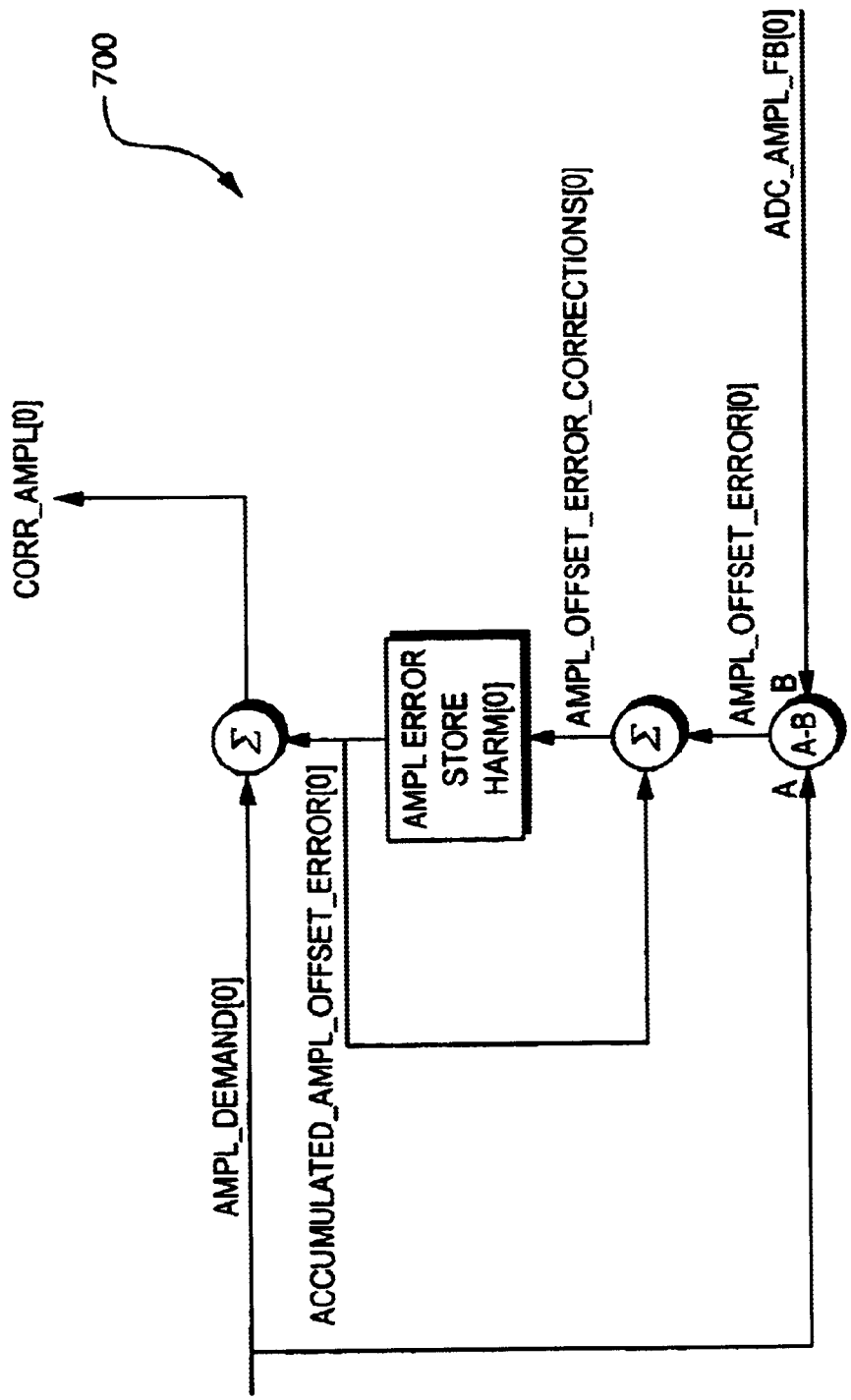
FIG. 7 is a block schematic diagram, showing conceptually how the DSP corrects a feedback DC amplitude in the frequency domain.

Reference is now therefore also made to FIGS. 5, 6 and 7, which explain how the correction is performed in the DSP 10,110.

FIG. 5 is a block schematic diagram, showing conceptually an algorithm 500 in which the DSP 10,110 corrects feedback amplitude and phase in the frequency domain for signals having an amplitude above a predetermined threshold. This algorithm is used for all demanded harmonics from 1 to n that have a value greater than the POLAR_CUT_OFF_THRESHOLD. The POLAR_CUT_OFF_THRESHOLD is defined to be at least ten times greater than any spurious, un-requested, harmonics to avoid mathematical problems with this algorithm. This algorithm works on both phase and amplitude separately. The user request amplitude (AMPL_DEMAND[1:n]) is divided by the harmonic component (1 to n) from the FFT (ADC_AMPL_FB[1:n]) giving a gain correction term (AMPL_GAIN_ERROR[1:n]). This signal (AMPL_GAIN_ERROR[1:n]) is then held (in AMPL ERROR STORE HARM[1:n]) and used as a multiplier on future error terms so that the corrective term (AMPL_GAIN_ERROR_CORRECTION[1:n]) is kept very close to unity, hence effectively acting as a gain integrator. The resultant value from the 'integrator' (ACC_AMPL_GAIN_ERROR[1:n]) is then multiplied by the user demand (AMPL_DEMAND[1:n]) to give the corrected harmonic amplitude.

The phase is handled separately, as follows. The harmonic phase component (1 to n) from the FFT (ADC_PHASE_FB[1:n]) is subtracted from the user request (PHASE_DEMAND[1:n]) giving an error term (PHASE_ERROR[1:n]). This signal (PHASE_ERROR[1:n]) is then summed (in PHASE ERROR STORE HARM[1:n]) and added to future error terms so that the corrective term (PHASE_ERROR_CORRECTION[1:n]) is kept small, hence effectively acting as an integrator. The resultant value from the 'integrator' (ACC_PHASE_ERROR[1:n]) is then added to the user demand (PHASE_DEMAND[1:n]) to give the corrected harmonic phase, along with any fixed phase corrections to compensate for filtering or amplifier phase shifts.

FIG. 6 is a block schematic diagram, showing conceptually an algorithm 600 in which the DSP 10,110 corrects feedback amplitude and phase in the frequency domain for signals having an amplitude below a predetermined threshold. The algorithm 600 is used for all harmonics from 1 to n that have a value less than or equal to the POLAR_CUT_OFF_THRESHOLD and more than the CUT_OFF_

THRESHOLD. The CUT_OFF_THRESHOLD is defined by the noise floor of the ADC sampling system. Any component below the CUT_OFF_THRESHOLD is in the noise floor and therefore it is pointless to try and correct for as it does not really exist. In algorithm 600, all calculations are done with complex numbers (vector quantities). The harmonic component (1 to n) from the FFT (RECT_FB[1:n] equals ADC_AMPL_FB[1:n] and ADC_PHASE_FB [1:n] combined into one vector quantity) is subtracted from the user request (RECT_DEMAND[1:n] equals AMPL_ DEMAND[1:n] and PHASE_DEMAND[1:n] combined into one vector quantity) giving an error term (RECT_ ERROR[1:n]). This signal (RECT_ERROR_ CORRECTION[1:n]) is then summed (in RECT ERROR STORE HARM[1:n]) and subtracted from future error terms so that the corrective term (RECT_ERROR_ CORRECTION[1:n]) is kept small, hence effectively acting as an integrator. The resultant value from the 'integrator' (ACC_RECT_ERROR[1:n]) is then added to the user demand (RECT_DEMAND[1:n]) to give the corrected harmonic component, along with any fixed phase corrections to compensate for filtering or amplifier phase shifts.

FIG. 7 is a block schematic diagram, showing conceptually an algorithm 700 in which the DSP 10,110 averages a feedback DC amplitude in the frequency domain. There is no phase component for DC. The DC component from the FFT (ADC_AMPL_FB[0]) is subtracted from the user request (AMPL_DEMAND[0]) giving an error term (AMPL_OFFSET_ERROR[0]). This signal (AMPL_ OFFSET_ERROR[0]) is then summed (in AMPL ERROR STORE HARM[0]) and added to future error terms so that the corrective term (AMPL_OFFSET_ERROR_ CORRECTION[0]) is kept small, hence effectively acting as an integrator. The resultant value from the 'integrator' (ACCUMULATED_AMPL_OFFSET_ERROR[0]) is then added to the user demand (AMPL_DEMAND[0]) and output to the DAC 70 as the new corrected value.

This results in an updated output set of amplitudes and phases 45,47 which is then processed by the inverse FFT 50 to yield a subsequent updated waveform Wn+1 which directed 52" by the load select function 54 into the next wavetable 58. In the meantime, the contents of the other wavetable 56 continue to be selected by the output select function 66 for the generation of the electronic test signal 86.

Once the subsequent updated waveform Wn+1 has been fully loaded, the output select function 66 is switched 65 to select the updated waveform Wn+1 for the generation of the electronic test signal 86.

Figure 4:
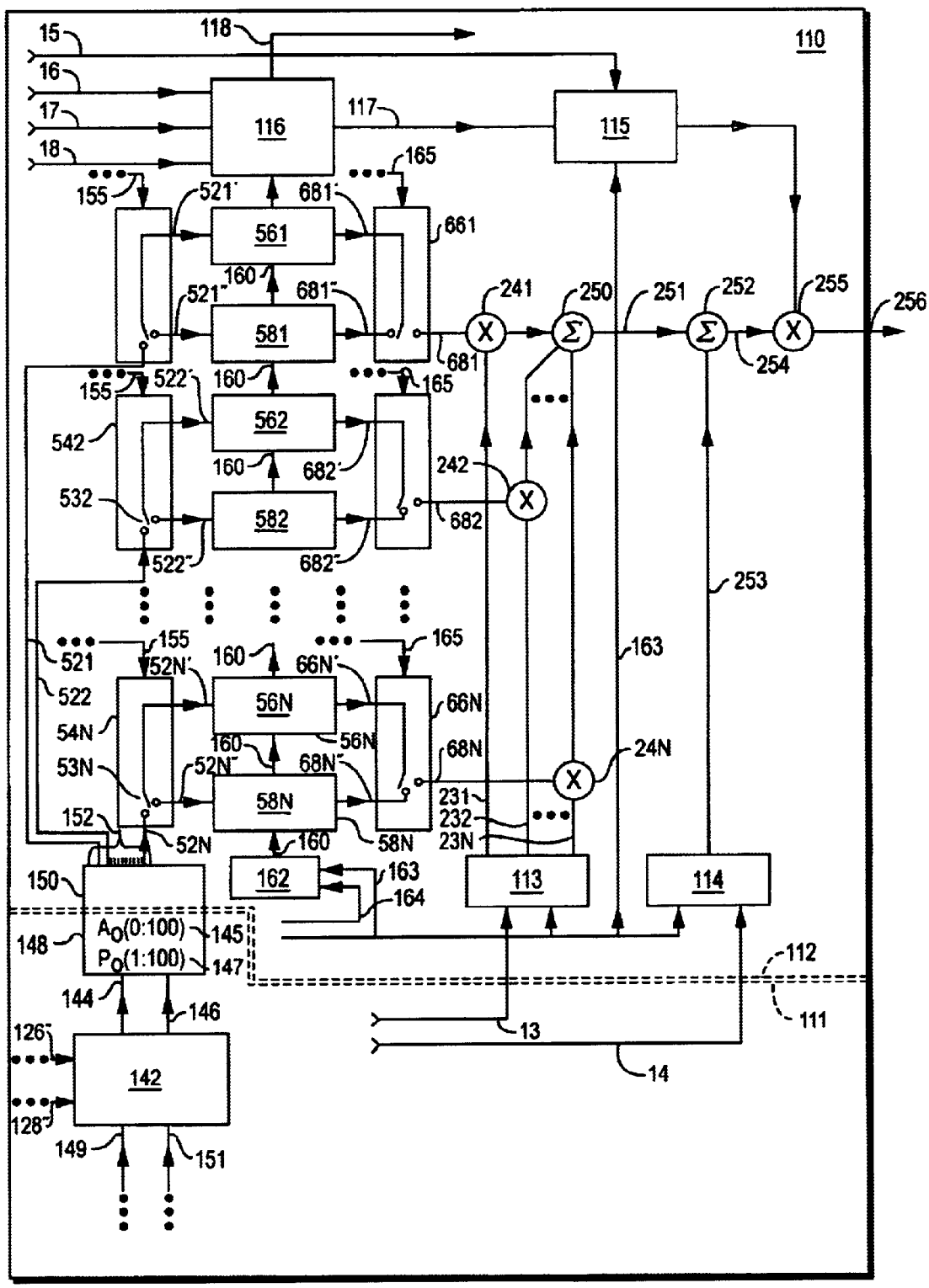
FIG. 4 is a block schematic diagram, showing conceptually how the apparatus of FIG. 1 works in a second embodiment of the invention having the capability to modulate the test signal.

Reference is now made to FIG. 4, which shows a DSP 110 similar to that of FIG. 2, for use in a second embodiment of the invention having the capability to modulate the test signal 86. In FIG. 4, features which correspond to those of FIG. 2 are indicated with reference numerals incremented by 100.

The DSP 110 differs from that of the DSP 10 of the first embodiment 1, in having user controllable inputs 13–18 for imparting a desired modulation onto the electronic test signal 86.

The DSP accepts set a user defined amplitudes (A(0:100)) and phases (P(1:100)) to generate corrected individual user defined amplitudes (Au) 126" and corrected individual user define phases (Pu) 128" in the same manner as in the first embodiment 1. Amplitude and phase control algorithms 142 also receive individual feedback amplitudes (AF) 149 and individual feedback phases (PF) 151 generated as described above, and compare these with the corresponding user defined values Au 126" and Pu 128" to calculate updated individual amplitudes (Ao) 144 and phases (Po) 146 in respectively the set of output amplitudes Ao(0:100) 145 and the set of output phases Po(1:100) 147, in the same manner as in the first embodiment 1.

The operation of the DSP differs from the point where the output sets of amplitudes and phases 145,147 are converted from the frequency (v) domain 111 to the time (t) domain 112 by an inverse FFT 150. The digitized waveform (Wn) 152 is generated separately either for groupings of harmonic components or, preferably, for each of the 101 harmonic components, from DC, the fundamental frequency, harmonic 2, up to harmonic 99. Each of the components is represented in FIG. 4 and the forgoing description with superscripts and reference digits ranging from 1 up to N, where N is less than or equal to 100. Preferably N is 100, in which case the modulation may be applied individually to each harmonic component of the electronic signal. If N is less than 100, then modulation may be applied to groupings of the harmonic components.

Each of the N waveform components ($Wn^1$, $Wn^2$, ... $Wn^N$) 521,522, ... 52N, is passed by a corresponding select function 541,542, ... 54N to one of a pair of wavetables 561,562, ... 56N, 581,582, ... 58N under the control of a common wavetable load select command (LS) 155. Each wavetable 561,562, ... 56N, 581,582, ... 58N is updated 521',521",522',522", ... 52N',52N" on alternate cycles of the feedback updating by the amplitude and phase closed loop algorithms 142, as described in relation to the first embodiment 1.

Also, as in the first embodiment 1, each pair of wavetables 561,562, ... 56N, 581,582, ... ,58N is connected to a corresponding output select function 661,662, ... ,66N, each of which operates in response to an output select signal (OS) 165 to direct 681',681",682',682", ... ,68N',68N" the contents of one of the pair of wavetables as a waveform output ($W^1n-1, W^2n-1, ..., W^Nn-1$) 681,682, ... ,68N for a particular harmonic component or group of harmonic components.

The DSP differs again from the DSP 10 of the first embodiment 1, in that each waveform 681,682, ... ,68N selected from the wavetables is then modified in several steps by up to three modulation stages. In the first stage, a user defined modulation 13 is received by a modulation waveform calculation stage 113, which provides N outputs 231,232, ... ,23N provides as inputs to N corresponding multiplication functions 241,242, ... ,24N along with the N waveforms 681,682, ... ,68N. The result of each multiplication is summed by a first adder 250, the output 251 of which is a modulated signal provided as an input to a second adder 252.

The second adder 252 receives another input 253 from an interharmonic waveform calculation stage 114, which itself receives a user defined interharmonic distortion. The user may define more than one interharmonic distortion to be added 251 to the modulated signal 251.

The summed result of the modulated signal 251 and the interharmonic(s) 253 is provided as an input 254 to a final multiplication stage 255 which modulates the signal 254 with a sag or swell provided by a sag/swell waveform calculation stage 115. This modulates the overall amplitude of the signal 256 generated by the final multiplication stage 255 equally for all the harmonic components.

The sag/swell waveform calculation stage 115 receives an input from a user defined sag/swell. The timing of the sag/swell in relation to the cycle and phase of the electronic test signal 86 is determined by a trigger controller 116 which generates a trigger output 117 for the sag/swell waveform calculation stage 115, depending on any or all of a user defined time delay 16, a user defined phase delay 17 and a user start trigger. The trigger controller also provides a trigger synch output 118 from the DSP 110, which may be used for synchronization purposes externally of the signal generation apparatus.

The modulated/distorted output signal 256 is then provided to the digital-to-analog output stage 5 illustrated in FIG. 3 for the generation of the electronic test signal 86.

It is important to note that when modulation/distortion is present in the electronic test signal 86, the feedback updating of the output sets of amplitudes and phases 145,147 must be temporarily suspended, because the feedback loop would then work against the distortion. However, as soon as the modulation/distortion ceases, then the feedback loop is re-engaged, helping to ensure the fidelity of the electronic test signal 86 with the user defined amplitudes Au 126" and phases Pu 128".

The DSP 110 described above can generate signals that are amplitude modulated such as flicker, as well as fluctuating signals by using added interharmonics and sag or swell signals. The digital feedback loop must be automatically disabled when generating these types of signals. This of course serves to reduce the overall system accuracy, which becomes heavily reliant on the accuracy of the amplifiers.

In order to restore a higher level of accuracy, the system may be connected to the load, and a non-modulated signal applied. With the digital feedback loop in operation, system inaccuracies and distortions are automatically corrected. Then when a modulated signal is selected, the feedback loop is disconnected, but correction factors stay active. Due to good amplifier design, overall system accuracy can thus be maintained for a period long enough to perform a number of measurements.

The use of a digital feedback loop provides a mechanism for maintaining accuracy on complex signals, in particular on signals where specified amounts of harmonic distortion are added. This technique allows for correction of further distortions introduced by the processes of digital to analogue conversion and amplification. It is possible to achieve uncertainties in the measurement of power to 200 ppm or better, on sinusoidal and non-sinusoidal signals. This technique also achieves very high accuracy and adjustment resolution of phase, not relying on any zero crossing techniques.

The system as proposed has a number of advantages over other methods.

Distortion on mains power line, or non-zero source impedance of mains power line, has no impact on overall measurement accuracy.

Instruments can be calibrated with signals more representative of the signals they will be deployed to measure.

Calibration uncertainties due to load variations are largely eliminated.

Multiple anomalies can be applied simultaneously in order to verify an instrument's interdependency between various signal types, and its capability to correctly distinguish and measure each form of distortion.

In summary, the calibration signal source described above resolves many of the difficulties associated with prior art devices. The system provides a signal source that provides high accuracy phantom power (separate voltage and current) to calibrate power measurement devices. In addition to pure sinusoidal signals, the system also has the capability to supply all forms of mains power supply degradations (frequency variation, harmonic distortion, interharmonics, fluctuating harmonics, flicker and dips and swells) currently defined by national standards and proposed national standards. The system described above is realized through the use of wavetable techniques and accurate amplifiers under the control of a digital feedback loop.

The invention described herein provides a number of benefits, particularly enhancements in phase accuracy. The phase accuracy attained is far beyond that achievable by zero crossing techniques. The problem of zero crossing phase measurement is that both distortion and random noise influence the detected point of zero crossing, hence degrading the measurement accuracy. The described technique above does not suffer these problems in the same way because each harmonic is separated out and independently corrected in its own right. In addition, noise has a much lesser impact on phase errors because of the averaging effect of the FFT.

The resultant achieved phase accuracy is in the order of 100 micro degrees or better at line frequencies of 50 Hz to 60 Hz. Measurements performed with signal generators according to the invention are limited mainly by existing equipment with which to compare.

The amplitude accuracy achieved within this specific implementation is in the order of 100 ppm of one year with a variation of no more than plus or minus five degrees centigrade.

The techniques described herein can be extended to much higher frequencies by making the wavetables (and 'phase' address counter, to drive the wavetables) external to the DSP. This would allow the memory to be cycled through at far higher speeds, for example 100 MHz or more, than when driven from the DSP. At such high speeds, both the DAC output tables and the ADC input tables would also need to be external of the DSP, as would the sequential logic counter to drive the memories.

It is to be recognized that various alterations, modifications, and/or additions may be introduced into the constructions and arrangements of parts described above without departing from the spirit or scope of the present invention, as defined by the appended claims.

What is claimed is:

1. An apparatus for generating an electronic test signal, comprising a user input control, a processor, a digital-to-analog output stage, a test signal output, a feedback input, and an analog-to-digital feedback input stage, wherein:

a) the user input control is operable to allow a user to select the frequency domain characteristics of a desired electronic test signal including a user-defined set of amplitudes and phases of a fundamental frequency and one or more harmonic frequencies;

b) the processor is arranged to receive from the user input control said user-defined set of amplitudes and phases and to generate from the user-defined set of amplitudes and phases an output set of amplitudes and phases for the fundamental frequency and one or more harmonic frequencies;

c) the processor is arranged to convert the output set of amplitudes and phases into a first time domain set of amplitudes extending over at least one cycle of the fundamental frequency;

d) the digital-to-analog output stage is arranged to receive from the processor the first time domain set of amplitudes and to generate therefrom an electronic test signal corresponding to the time domain set of amplitudes and to present said electronic test signal to the test signal output;

e) the feedback signal input is operable to allow a user to feed back the electronic test signal into the analog-to-digital feedback input stage and to generate therefrom a feedback time domain set of amplitudes extending over at least one cycle of the fundamental frequency;

f) the processor is arranged to receive the feedback time domain set of amplitudes and to generate from the feedback time domain set of amplitudes a feedback frequency domain set of amplitudes and phases for the fundamental frequency and one or more harmonic frequencies; and g) the processor is arranged to compare the feedback frequency domain set of amplitudes and phases with the user-defined set of amplitudes and phases, and when necessary to modify the output set of amplitudes and phases depending on said comparison in order to reduce any differences between the feedback frequency domain set of amplitudes and phases and the user-defined set of amplitudes and phases.

2. The apparatus of claim 1, the digital-to-analog output stage comprising a digital-to-analog converter (DAC), and an output amplifier, wherein the DAC is arranged to receive from the processor the first time domain set of amplitudes and to generate therefrom an output analog signal, and the output amplifier is arranged to receive said output analog signal and to generate from this said electronic test signal corresponding to the time domain set of amplitudes.

3. The apparatus of claim 1, the analog-to-digital feedback input stage comprising an input amplifier an analog-to-digital converter (ADC), wherein the input amplifier is arranged to receive said feedback electronic test signal and to generate therefrom a feedback analog signal, and the ADC is arranged to receive said feedback analog and to generate from this said feedback time domain set of amplitudes.

4. The apparatus of claim 1, wherein the processor is arranged to correct any differences between the feedback frequency domain set of amplitudes and phases and the user-defined set of amplitudes and phases prior to said modification of the output set of amplitudes and phases.

5. The apparatus of claim 1, the processor comprising a memory, wherein the memory is arranged to store said first time domain set of amplitudes, and the digital-to-analog output stage is arranged to receive from the memory said stored first time domain set of amplitudes.

6. The apparatus of claim 5, wherein: the memory is arranged to store more than one set of time domain amplitudes, including a current time domain set of amplitudes and a subsequent time domain set of amplitudes; each of said sets extends over at least one cycle of the fundamental frequency; the digital-to-analog output stage is arranged to receive at any one time just one of said time domain sets.

7. The apparatus as claimed in claim 6, wherein the processor is arranged to convert said modified output set of amplitudes and phases into said subsequent time domain set of amplitudes.

8. The apparatus of claim 7, wherein the processor is arranged to switch from the current time domain set of amplitudes to the subsequent time domain set of amplitudes.

9. The apparatus of claim 8, wherein the processor includes a control input by which said switch from the current time domain set of amplitudes to the subsequent time domain set of amplitudes is controlled.

10. The apparatus of claim 9, wherein said control input is a user-actuatable control input.

11. The apparatus of claim 8, wherein the processor is arranged to switch automatically from the current time domain set of amplitudes to the subsequent time domain set of amplitudes in order continuously to correct said generated electronic test signal.

12. The apparatus of claim 1, wherein: the processor is arranged: first to convert the output set of amplitudes and phases into a harmonically decomposed time domain set of amplitudes, said decomposed set comprising a first time domain sub-set of amplitudes for at least one frequency and at least one further first time domain sub-set of amplitudes for at least one further frequency, each of said sub-sets for said at least one frequency and said at least one further frequency extending over at least one cycle of the fundamental frequency; second, to apply a desired modulation for at least one frequency to at least one of said sub-sets of amplitudes; and third, to re-combine each of said first time domain sub-sets for the fundamental and harmonic frequencies to generate said first time domain set of amplitudes.

13. The apparatus of claim 12, wherein: the user input control is operable to allow a user to select at least one form of desired modulation to at least one of said frequencies; and the processor is arranged to apply said modulation to the time domain sub-set(s) of amplitudes for the or each corresponding frequency, prior to said re-combination of each of said first time domain sub-sets to generate said first time domain set of amplitudes.

14. The apparatus of claim 12, in which said first time domain sub-set of amplitudes is for at least the fundamental frequency and said at least one further first time domain sub-set of amplitudes is for one or more corresponding harmonic frequencies.

15. The apparatus of claim 14, wherein: the user input control is operable to allow a user to select at least one form of desired modulation to the fundamental frequency and/or one or more of the harmonic frequencies of said desired electronic test signal; and the processor is arranged to apply said desired modulation to the corresponding time domain sub-sets of amplitudes for the fundamental frequency and/or one or more of the harmonic frequencies, prior to said re-combination of each of said first time domain sub-sets to generate said first time domain set of amplitudes.

16. The apparatus of claim 12, the processor comprising a memory, said memory comprising a plurality of memory locations, wherein the memory is arranged to store each of said first time domain sub-sets of amplitudes in corresponding ranges of memory locations.

17. The apparatus of claim 12, wherein the processor is adapted to delay said modification to the output set of amplitudes and phases depending on said comparison of the feedback frequency domain set of amplitudes and phases with the user-defined set of amplitudes and phases, when the processor is applying said desired modulation to the corresponding time domain sub-sets of amplitudes.

18. The apparatus of claim 12, wherein the processor is adapted to suspend said comparison of the feedback frequency domain set of amplitudes and phases with the user-defined set of amplitudes and phases, when the processor is applying said desired modulation to the corresponding time domain sub-sets of amplitudes.

19. The apparatus of claim 1, wherein the user input control is operable to allow a user to select the frequency domain characteristics of a desired electronic test signal including a user-defined DC amplitude level, said user-defined DC amplitude level being included in the user-defined set of amplitudes and phases as a zeroth harmonic.

20. The apparatus of claim 1, wherein the processor comprises a digital signal processor (DSP).

21. A method for generating an electronic test signal, using an apparatus comprising a user input control, a processor, a digital-to-analog output stage, a test signal output, a feedback input, and an analog-to-digital feedback input stage, wherein the method comprises the steps of:

i) selecting via the user input control the frequency domain characteristics of a desired electronic test signal including a user-defined set of amplitudes and phases of a fundamental frequency and one or more harmonic frequencies;

ii) communicating said user-defined set of amplitudes and phases to the processor and using the processor to generate from the user-defined set of amplitudes and phases an output set of amplitudes and phases for the fundamental frequency and one or more harmonic frequencies;

iii) using the processor to convert the output set of amplitudes and phases into a first time domain set of amplitudes extending over at least one cycle of the fundamental frequency;

iv) communicating the first time domain set of amplitudes to the digital-to-analog output stage and using the digital-to-analog output stage to generate an electronic test signal corresponding to the time domain set of amplitudes, and providing at the test signal output said electronic test signal;

v) providing feed back from the electronic test signal at the feedback signal input and communicating said feedback to the analog-to-digital feedback input stage and using the analog-to-digital feedback input stage to generate a feedback time domain set of amplitudes extending over at least one cycle of the fundamental frequency;

vi) communicating the feedback time domain set of amplitudes to the processor and using the processor to generate from the feedback time domain set of amplitudes a feedback frequency domain set of amplitudes and phases for the fundamental frequency and one or more harmonic frequencies; and vii) using the processor to compare the feedback frequency domain set of amplitudes and phases with the user-defined set of amplitudes and phases, and when necessary modifying the output set of amplitudes and phases depending on said comparison in order to reduce any differences between the feedback frequency domain set of amplitudes and phases and the user-defined set of amplitudes and phases.

* * * * *